(12) United States Patent
Ko et al.

(10) Patent No.: US 8,536,718 B2
(45) Date of Patent: Sep. 17, 2013

(54) INTEGRATED CIRCUIT PACKAGING SYSTEM WITH TRENCHES AND METHOD OF MANUFACTURE THEREOF

(75) Inventors: WonJun Ko, Sungnam-Si (KR); Oh Han Kim, Ichon-si (KR)

(73) Assignee: Stats Chippac Ltd., Singapore (SG)

( * ) Notice: Subject to any disclaimer, the term of this patent is extended or adjusted under 35 U.S.C. 154(b) by 328 days.

(21) Appl. No.: 12/822,405

(22) Filed: Jun. 24, 2010

(65) Prior Publication Data

US 2011/0316162 A1    Dec. 29, 2011

(51) Int. Cl.
*H01L 23/31* (2006.01)

(52) U.S. Cl.
USPC .............. 257/787; 257/690; 174/261

(58) Field of Classification Search
USPC   257/E23.131, 737, 787, 798, E23.123–E23.128,
257/E21.502, E21.503, 773, 778, E21.509,
257/E23.079, E23.129, 690; 438/106, 125–127,
438/758, 759, 778, 787, 108; 174/261;
361/748, 761, 762
See application file for complete search history.

(56) References Cited

U.S. PATENT DOCUMENTS

| | | | | |
|---|---|---|---|---|
| 5,489,749 A * | 2/1996 | DiStefano et al. | | 174/261 |
| 5,647,123 A | 7/1997 | Greenwood et al. | | |
| 5,773,895 A * | 6/1998 | Hassan et al. | | 257/774 |
| 5,920,126 A * | 7/1999 | Sohara | | 257/778 |
| 6,049,122 A * | 4/2000 | Yoneda | | 257/668 |
| 6,225,695 B1 * | 5/2001 | Chia et al. | | 257/712 |
| 6,919,630 B2 * | 7/2005 | Hsiao | | 257/706 |
| 6,946,741 B2 * | 9/2005 | Yamashita | | 257/778 |
| 7,102,239 B2 | 9/2006 | Pu et al. | | |
| 7,122,893 B2 | 10/2006 | Weng et al. | | |
| 7,179,683 B2 | 2/2007 | Low et al. | | |
| 7,339,262 B2 * | 3/2008 | Son et al. | | 257/671 |
| 7,449,770 B2 * | 11/2008 | Lin et al. | | 257/667 |
| 7,550,856 B2 * | 6/2009 | Libres et al. | | 257/777 |
| 7,564,140 B2 | 7/2009 | Lee et al. | | |
| 7,598,608 B2 * | 10/2009 | Kunimoto et al. | | 257/692 |
| 7,682,872 B2 | 3/2010 | Park et al. | | |
| 7,838,998 B2 * | 11/2010 | Ozawa et al. | | 257/778 |
| 7,880,314 B2 * | 2/2011 | Sohara | | 257/778 |
| 7,884,482 B2 * | 2/2011 | Ozawa et al. | | 257/773 |
| 2006/0091523 A1 * | 5/2006 | Shimanuki | | 257/698 |
| 2007/0108628 A1 * | 5/2007 | Ozawa et al. | | 257/778 |
| 2007/0126110 A1 * | 6/2007 | Kwon et al. | | 257/690 |
| 2007/0145553 A1 * | 6/2007 | Araki et al. | | 257/678 |
| 2007/0252286 A1 * | 11/2007 | Kunimoto et al. | | 257/778 |
| 2008/0017983 A1 | 1/2008 | Tzeng et al. | | |
| 2008/0246163 A1 * | 10/2008 | Tanida et al. | | 257/778 |
| 2009/0243091 A1 | 10/2009 | Kim et al. | | |
| 2010/0025847 A1 | 2/2010 | Tomura et al. | | |
| 2011/0115083 A1 * | 5/2011 | Zang et al. | | 257/738 |

FOREIGN PATENT DOCUMENTS

JP    11-150206 A    6/1999

* cited by examiner

*Primary Examiner* — Fernando L Toledo
*Assistant Examiner* — Victoria K Hall
(74) *Attorney, Agent, or Firm* — Ishimaru & Associates LLP

(57) ABSTRACT

A method of manufacture of an integrated circuit packaging system includes: providing a substrate with a material layer including grooves in a fillet region that are substantially parallel and adjacent an integrated circuit; and forming a resin between the substrate and the integrated circuit that contacts a trench trace exposed by the grooves.

28 Claims, 4 Drawing Sheets

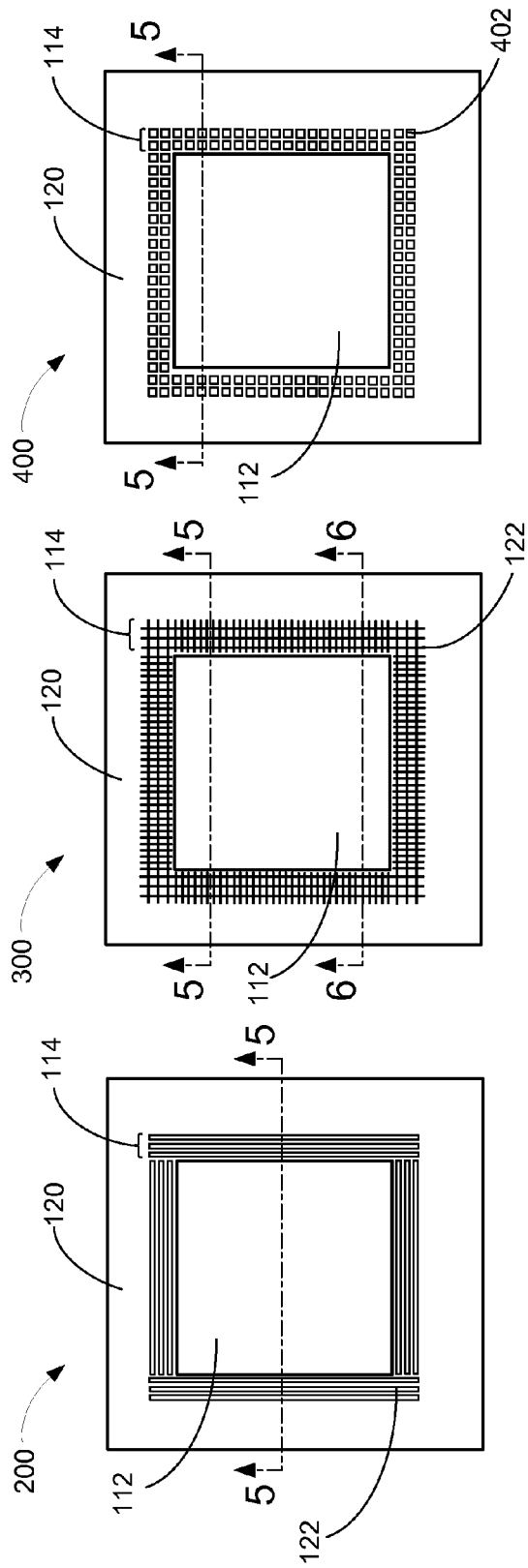

US 8,536,718 B2

INTEGRATED CIRCUIT PACKAGING SYSTEM WITH TRENCHES AND METHOD OF MANUFACTURE THEREOF

TECHNICAL FIELD

The present invention relates generally to an integrated circuit packaging system, and more particularly to an integrated circuit packaging system with trenches in a material layer.

BACKGROUND ART

Integrated circuits find application in many of today's consumer electronics, such as cell phones, video cameras, portable music players, printers, computers, etc. Integrated circuits may include a combination of active devices, passive devices and their interconnections.

Flip chip packaging is an advanced integrated packaging design that meets the demand for faster integrated circuit technology with increased input/output (I/O) leads. Flip chip packaging is a technique of mounting the active side of a chip with the surface bonding pads toward the substrate. This packaging technique is currently the design with the shortest path from the chip to the substrate, thereby providing a good electrical connection for high speed signals.

Capillary underfill techniques are becoming very important for new product development within the flip chip device market. Typically, flip chip devices and/or packages utilizing capillary underfill material have encountered various defects, such as bleeding on the printed circuit board surface (due to the low viscosity of the capillary underfill material) and/or delamination problems between the underfill and the solder resist material. Commonly, these delamination problems occur because of moisture absorption at the capillary underfill fillet area between the flip chip device and the printed circuit board due to low fillet strength. It is known that the fillet area of a flip chip device experiences more stress than the center of the device or package.

Thus, a need still remains for a reliable integrated circuit packaging system and method of fabrication, wherein the integrated circuit packaging system exhibits reduced resin or underfill bleeding, reduced delamination problems, reduced moisture absorption, and increased fillet strength. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a substrate with a material layer including grooves in a fillet region that are substantially parallel and adjacent an integrated circuit; and forming a resin between the substrate and the integrated circuit that contacts a trench trace exposed by the grooves.

The present invention provides an integrated circuit packaging system, including: a substrate with a material layer including grooves in a fillet region that are substantially parallel and adjacent an integrated circuit; and a resin between the substrate and the integrated circuit that contacts a trench trace exposed by the grooves.

Certain embodiments of the invention have other steps or elements in addition to or in place of those mentioned above. The steps or elements will become apparent to those skilled in the art from a reading of the following detailed description when taken with reference to the accompanying drawings.

BRIEF DESCRIPTION OF THE DRAWINGS

FIG. 2 is a plan view of an integrated circuit packaging system in accordance with another embodiment of the present invention.

FIG. 3 is a plan view of an integrated circuit packaging system in accordance with another embodiment of the present invention.

FIG. 4 is a plan view of an integrated circuit packaging system in accordance with another embodiment of the present invention.

BEST MODE FOR CARRYING OUT THE INVENTION

Figure 1:
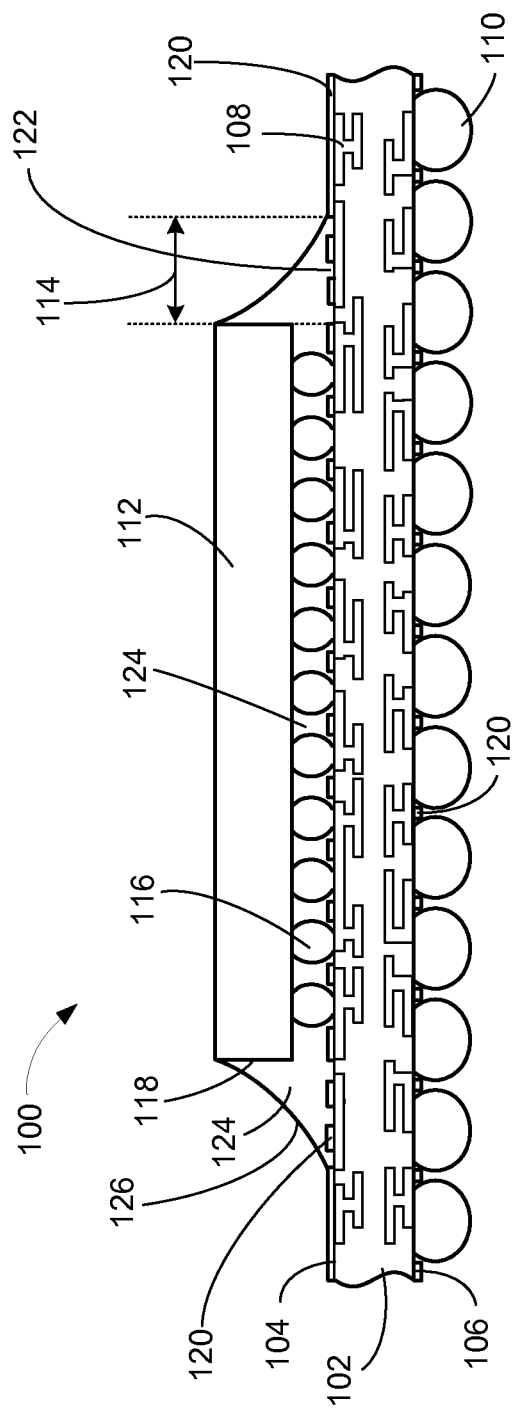
FIG. 1 is a partial cross sectional view of an integrated circuit packaging system in accordance with an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals.

For expository purposes, the term "horizontal" as used herein is defined as a plane parallel to the plane or surface of the substrate, regardless of its orientation. The term "vertical"

refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "processing" as used herein includes deposition of material or photoresist, patterning, exposure, development, etching, cleaning, and/or removal of the material or photoresist as required in forming a described structure.

The term "on" is used herein to mean there is direct contact between elements.

The terms "example" or "exemplary" are used herein to mean serving as an instance or illustration. Any aspect or embodiment described herein as an "example" or as "exemplary" is not necessarily to be construed as preferred or advantageous over other aspects or designs.

The terms "first" and "second" as used herein are for purposes of differentiation between elements only and are not to be construed as limiting the scope of the present invention.

Objects described herein as being "adjacent to" each other may be in close proximity to each other, e.g., separated only by the minimum distance required by the current technology node, or in the same general region or area as each other, as appropriate for the context in which the phrase is used.

FIGS. 1-7, which follow, depict by way of example and not by limitation, exemplary embodiments for the formation of an integrated circuit packaging system and they are not to be construed as limiting. It is to be understood that a plurality of conventional processes that are well known within the art and not repeated herein, may precede or follow FIGS. 1-7. Moreover, it is to be understood that many modifications, additions, and/or omissions may be made to the below described processes and/or embodiments without departing from the scope of the claimed subject matter. For example, the below described processes and/or embodiments may include more, fewer, or other steps. Additionally, steps may be performed in any suitable order without departing from the scope of the present invention.

Moreover, it is to be appreciated that the integrated circuit packaging system of the present disclosure may include any number of integrated circuit devices or packages, such as but not limited to, memory circuits, logic circuits, analog circuits, digital circuits, passive circuits, RF circuits, or a combination thereof, for example. Moreover, it is to be understood that the integrated circuit packaging system manufactured by the embodiments described herein can be used within processor components, memory components, logic components, digital components, analog components, mixed-signal components, power components, radio-frequency (RF) components, digital signal processor components, micro-electromechanical components, optical sensor components, or a combination thereof, in numerous configurations and arrangements as may be needed.

Furthermore, it is to be understood that one or more of the integrated circuit packaging system could be prepared at one time on a medium, which could be separated into individual or multiple integrated circuit package assemblies at a later stage of fabrication.

It should be understood that the definitions and nomenclature used herein are given by way of example only and that one skilled in the art would readily understand that other definitions and nomenclature may be used to illustrate the techniques, systems, devices, and methods described herein.

Referring now to FIG. 1, therein is shown a partial cross sectional view of an integrated circuit packaging system 100 in accordance with an embodiment of the present invention. Generally, the integrated circuit packaging system 100 may include a substrate 102, such as a printed circuit board (PCB), a carrier substrate, an interposer, a semiconductor substrate with electrical interconnections, or a multi-layer structure (e.g., a laminate with one or more conductive layers separated by an insulator) suitable for electrically interconnecting integrated circuit systems formed on or above the substrate 102 to external electrical circuits.

Generally, the substrate 102 may include a first side 104 (e.g., a top surface) within a different plane and opposing a second side 106 (e.g., a bottom surface). Conductive pathways 108, which may include a combination of traces, vias, and/or redistribution layers, provide an electrical connection between the first side 104 and the second side 106 of the substrate 102. The conductive pathways 108 terminating at the first side 104 electrically connect to conductive pads (not shown) formed in a pre-selected pattern to correspond with the electrical connection configuration of an overlying device. By way of example, the conductive pads on the first side 104 may include a land grid array (LGA) configuration or a ball grid array (BGA) configuration.

The conductive pathways 108 terminating at the second side 106 (e.g., at the conductive pads) may provide further electrical connections to external electrical circuits via bottom conductors, such as an external terminal 110. It will be appreciated by those skilled in the art that the external terminal 110 may include solder balls formed as part of a ball grid array structure. Although the present embodiment depicts the external terminal 110 as a solder ball, it is to be understood that the external terminal 110 may include any interface connection technology, such as a pin or land grid array that establishes electrical contact between the integrated circuit packaging system 100 and external electrical circuits.

Formed over and/or directly on the substrate 102 is an integrated circuit 112. The integrated circuit 112 can be attached to the substrate 102 by techniques well known within the art and not described herein. In at least one embodiment, the integrated circuit 112 can be mounted over or on the first side 104 of the substrate 102 adjacent and inward of a trench 114. The integrated circuit 112 can be substantially centered over the substrate 102, but is not required to be and may include an offset configuration as well.

Generally, the integrated circuit 112 may include one or more active devices, passive devices, or a combination thereof, vertically stacked or located within the same plane. By way of example, and not by way of limitation, the integrated circuit 112 may include one or more semiconductor chips or die that transmit, receive, modulate and/or alter electrical signals, such as stacked devices, modular devices, ASIC devices, memory devices, RF devices, analog devices or a combination thereof. In other embodiments, the integrated circuit 112 may further include, by way of example and not by way of limitation, one or more integrated circuit packages that transmit, receive, modulate and/or alter electrical signals, such as leaded and non-leaded packages, internal stacking module packages, flip-chip packages, modular packages, application-specific-integrated-circuit (ASIC) packages, RF packages, analog packages, memory packages, stacked die packages or a combination thereof.

In at least one embodiment, the integrated circuit 112 includes a flip-chip die electrically attached to the substrate 102 by a solder bump 116, which can also be a solder paste or ball, for example. Accordingly, the embodiment embraces electrically connecting the integrated circuit 112 to the substrate 102 by all known ball grid array and land grid array contact techniques.

Furthermore, it is to be understood that the integrated circuit 112 may also include Package-in-Package (PiP) and Package-on-Package (PoP) configurations. The PiP system is a three-dimensional (3D) package system that stacks a fully tested Internal Stacking Module (ISM) on top of a Base Assembly Package (BAP) to form a single Chip Scale Package (CSP). PoP is a 3D package in which fully tested packages are stacked on top of another single or stacked package during the board mount process.

As such, it is to be understood that the integrated circuit 112 covers a wide range of semiconductor chip and integrated circuit package configurations involving various sizes, dimensions, and functional applications, and the type of chip or package configuration employed should only be limited by the design specifications of the integrated circuit packaging system 100.

Moreover, it will be appreciated by those skilled in the art that the present embodiments permit the testing of the integrated circuit 112 before adhering it to the substrate 102, thereby ensuring the use of known good die or packages in the manufacturing process. Additionally, after completing the integrated circuit packaging system 100, this assembly can also be tested before incorporation into additional package systems. This ensures that the final product includes known good assemblies, thereby improving the manufacturing process yield for the integrated circuit packaging system 100.

Generally, the trench 114 can be formed around the perimeter of the integrated circuit 112. The term "trench" is defined to mean an area of two or more substantially parallel grooves or rows of holes formed within a surface of a material by removing the material along one or more sides of the integrated circuit 112. In at least one embodiment, the trench 114 can be limited to an underfill fillet region of about 1.0 to about 1.5 millimeters as measured from a sidewall 118 of the integrated circuit 112. However, it is to be understood that the area of the trench 114 is not limited to the preceding example and may include any area that is commensurate with the current technology node fillet area.

The terms "fillet", "fillet region", or "fillet area" are defined to mean a uniform or non-uniform area or volume of excess underfill material that is formed between the sidewall 118 of the integrated circuit 112 and the first side 104 of the substrate 102. It is to be understood that the fillet region is formed by forces pushing or drawing out the underfill material to an area adjacent and not underneath the integrated circuit 112. It will be appreciated by those skilled in the art that the fillet region is an attribute of underfill materials and epoxies that is incorporated into the assembly of integrated circuit packages that helps to protect the mechanical connections from environmental damage.

Additionally, it will be appreciated by those skilled in the art that the area of the trench 114 can be larger than the underfill fillet area of the current technology node, if necessary. As will be evident to those skilled in the art, a design tolerance that permits the trench 114 to be larger or slightly larger than the conventional fillet area will increase the process latitude of the system, thereby enabling more products to meet the specified design requirements of the integrated circuit packaging system 100.

Generally, the trench 114 can be formed within a material layer 120 that is formed over or directly on the first side 104 of the substrate 102. By way of example, the material layer 120 may include an insulation layer, a solder resist, or a combination thereof. The material layer 120 may also be formed on the second side 106 of the substrate 102, although not required.

Figure 5:
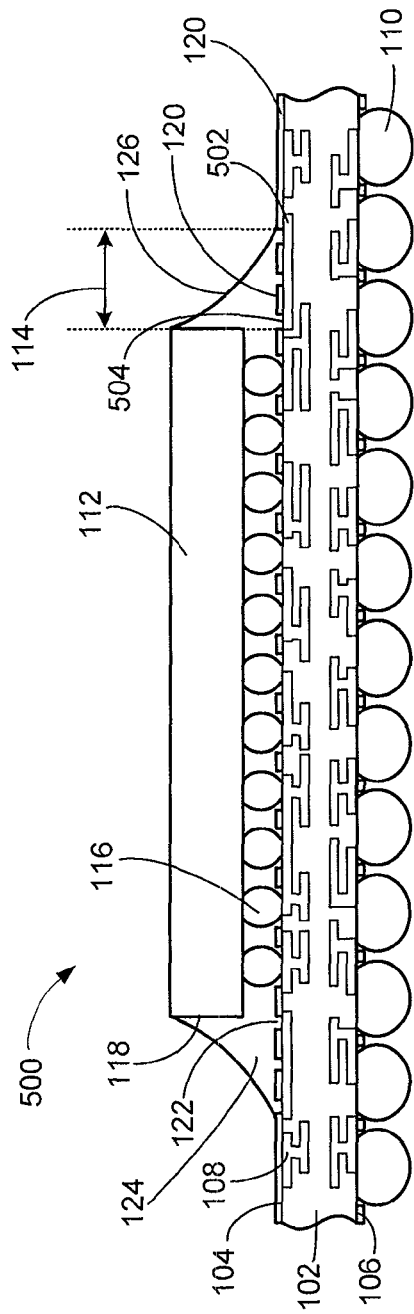
FIG. 5 is a cross sectional view of an integrated circuit packaging system in accordance with another embodiment of the present invention.

In at least one embodiment, grooves 122 (or holes 402 of FIG. 4) of the trench 114 can be formed entirely through the material layer 120 thereby exposing the first side 104 of the substrate 102 or a trench trace 502 of FIG. 5 of the substrate 102 formed underneath the trench 114. The trench trace 502 embedded in the substrate 102 can also be referred to as an embedded trench trace. In another embodiment, the grooves 122 of the trench 114 can be formed to only partially pass through about ten percent to about ninety percent of the material layer 120.

Additionally, although the current embodiment depicts three of the grooves 122 formed in the trench 114, it is to be understood that the trench 114 may include any number of the grooves 122 that is greater than one as required by the design specifications of the integrated circuit packaging system 100.

The grooves 122 can be separated by only the minimum distance required by the current technology node or they can be separated by a distance in excess of the current technology node. It is to be understood that the separation between the grooves depends, for example, upon the size of the grooves 122, the number of the grooves 122, and/or the size of the trench 114 desired.

In at least one embodiment, the trench 114 can be aligned to the sidewall 118 of the integrated circuit 112; however, it is to be understood that the trench 114 is not required to be aligned with the sidewall 118 and may extend inward or outward of the sidewall.

Formed between the substrate 102 and the integrated circuit 112 can be a resin 124, such as a capillary underfill material or a "no-flow" underfill material. Generally, the resin 124 may be chosen to reduce stresses arising from a coefficient of thermal expansion (CTE) mismatch between the substrate 102 and the integrated circuit 112, promote adhesion between the substrate 102 and the integrated circuit 112, as well as, reduce bleed out of the resin 124. It will be appreciated by those skilled in the art that the resin 124 can be pre-applied to the substrate 102, to the integrated circuit 112, and/or applied as a capillary underfill material between a connected configuration of the substrate 102 and the integrated circuit 112. The resin 124 can cover all sides of the integrated circuit 112 except for a completely visible side of the integrated circuit 112. The visible side is opposite and facing away from the first side 104 of the substrate 102.

Generally, the resin 124 forms a fillet structure 126 such as a concave junction formed between the sidewall 118 of the integrated circuit 112 and the first side 104 of the substrate 102, the material layer 120, and/or the trench trace 502. In at least one embodiment, the fillet structure 126 can be formed entirely within the area defined by the trench 114 (e.g., within the fillet region) between the sidewall 118 of the integrated circuit 112 and the first side 104 of the substrate 102, the material layer 120, and/or the trench trace 502. However, it is to be understood that the fillet structure 126 may exceed the dimensions of the trench 114 and be formed between the sidewall 118 and the material layer 120 and/or any material formed underneath the grooves 122 of the trench 114.

The fillet structure 126 can be formed along one or more edges, including corners, of the integrated circuit 112. It will be appreciated by those skilled in the art that numerous variables can be manipulated to control the formation of the fillet structure 126, such as: viscosity, volume, surface tension, and/or temperature of the resin 124, as well as the surface characteristics and temperature of the integrated circuit 112 and the substrate 102. It is to be understood that the resin 124 and the fillet structure 126 can be cured by annealing processes well known in the art and not repeated herein.

It is to be understood that the integrated circuit packaging system 100 may undergo a cleaning step to remove surface contaminants, such as particles, mobile ionic contaminants, organics and native oxides, before the formation of the resin 124.

It has been discovered that the trench 114 design of the integrated circuit packaging system 100 provides reduced resin bleed out, regardless of the type of underfill material employed, because the grooves 122 in the material layer 120 of the current embodiments act as a barrier to resin bleed. Notably, the effect of reduced resin bleed out is further enhanced for amine type underfill materials.

It has been discovered that the trench 114 of the current embodiments provides enhanced mechanical strength at the interface between the resin 124 and the material layer 120 because the grooves 122 within the material layer 120 provide a locking effect to the resin 124.

It has been discovered that the trench 114 configuration of the current embodiments provides improved moisture resistance by blocking moisture absorption that often occurs between the resin 124 and the material layer 120, thereby increasing the reliability performance of the integrated circuit packaging system 100. Not wishing to be limited to any particular theory, the inventors believe that forming two or more of the grooves 122 within the material layer 120 provides a labyrinth seal around the integrated circuit 112 that reduces moisture absorption.

It has been discovered that the above listed aspects of the current embodiments can be achieved without increasing the footprint of the integrated circuit packaging system 100 because the trench 114 can be made entirely within the fillet region or area of the resin 124.

Referring now to FIG. 2, therein is shown a plan view of an integrated circuit packaging system 200 in accordance with another embodiment of the present invention. The integrated circuit packaging system 200 includes the integrated circuit 112, the trench 114, the material layer 120, and the grooves 122. Generally, the grooves 122 can be referred to as parallel grooves and formed as two or more parallel or substantially parallel channels within the material layer 120 along and substantially parallel to the sides of the integrated circuit 112. In at least one embodiment, opposing sides of the integrated circuit 112 can be configured such that the grooves 122 do not exceed a length of the corresponding side of the integrated circuit 112, while the other opposing sides of the integrated circuit 112 can be configured such that the grooves 122 do exceed a length of the corresponding side of the integrated circuit 112. In such cases, the grooves 122 do not overlap.

However, it is to be understood that the length of the grooves 122 is not limited to the preceding example and may include any length less than, equal to, or in excess of the corresponding side length dimension of the integrated circuit 112. Although not depicted, it is to be understood that the grooves 122 can overlap at the corners of the integrated circuit 112, if desired.

Generally, the grooves 122 are configured as parallel adjacent offset channels displaced outward from the integrated circuit 112. Although the current embodiment depicts three of the grooves 122 formed within the trench 114, it is to be understood that the trench 114 may include two or more of the grooves 122 as required by the design specifications of the integrated circuit packaging system 200.

Referring now to FIG. 3, therein is shown a plan view of an integrated circuit packaging system 300 in accordance with another embodiment of the present invention. The integrated circuit packaging system 300 includes the integrated circuit 112, the trench 114, the material layer 120, and the grooves 122.

Generally, the grooves 122 can be formed as two sets of perpendicular or substantially perpendicular channels along each of the sides of the integrated circuit 112. The first set of channels may include two or more substantially parallel channels having the parallel grooves within the material layer 120 along and substantially parallel to each of the sides of the integrated circuit 112, while the second set of perpendicular channels may include two or more substantially parallel channels having perpendicular grooves within the material layer 120 along and substantially perpendicular to each of the sides of the integrated circuit 112 and to the first set of channels. In such cases, the parallel grooves and the perpendicular grooves can be described as a cross-hatch design wherein the two sets of parallel channels are configured within and to intersect only in the trench 114.

In at least one embodiment, opposing sides of the integrated circuit 112 can be configured such that one set of the grooves 122 exceeds a length of the corresponding side of the integrated circuit 112, while the other set of the grooves is bounded by the area of the trench 114 or at least substantially bounded by the area of the trench 114. In such cases, the grooves 122 form a cross-hatch configuration substantially confined within the area of the trench 114.

However, it is to be understood that the length of the grooves 122 is not limited to the preceding examples and may include any length less than, equal to, or in excess of the corresponding side length dimension of the integrated circuit 112 or corresponding dimension of the trench 114.

Generally, a first set of the grooves 122 are configured as parallel adjacent offset channels displaced outward from the integrated circuit 112, while a second set of the grooves 122 are configured as parallel adjacent offset channels that are substantially perpendicular to the first set of the grooves 122 and the side of the integrated circuit 112. Although the current embodiment depicts a finite number of the grooves 122 formed within each of the trench 114, it is to be understood that the trench 114 may include two or more of the grooves 122 as required by the design specifications of the integrated circuit packaging system 300.

Referring now to FIG. 4, therein is shown a plan view of an integrated circuit packaging system 400 in accordance with another embodiment of the present invention. The integrated circuit packaging system 400 includes the integrated circuit 112, the trench 114, the material layer 120, and the holes 402. Generally, the holes 402 can be formed as two or more parallel or substantially parallel rows of the holes 402 within the material layer 120 along and substantially parallel to each side of the integrated circuit 112. In at least one embodiment, opposing sides of the integrated circuit 112 can be configured such that the rows of the holes 402 do not exceed a length or are substantially equal to a length of the corresponding side of the integrated circuit 112, while the other opposing sides of the integrated circuit 112 can be configured such that the rows of the holes 402 do exceed a length of the corresponding side of the integrated circuit 112. A line segment formed intersecting a center of the holes in any one of the rows is substantially parallel to sidewalls of in rows adjacent an integrated circuit package. The line segment of each of the rows formed by the holes have a length at least as long as a length of an adjacent one of the sidewalls. The trench and holes in the trench are formed around a perimeter of the integrated circuit package.

Generally, it is to be understood that the size, shape, and number of the holes 402 is not critical; what is important is that the holes 402 be of a number sufficient to reduce resin bleed, provide reinforced mechanical strength at the fillet, and/or help to reduce moisture absorption by creating a tight bond with the underlying material. In at least one embodiment, the holes 402 are formed as discrete individual openings within the material layer 120.

Generally, the holes 402 are configured as parallel adjacent offset rows of the holes 402 displaced outward from the integrated circuit 112. Although the current embodiment depicts two rows of the holes 402 formed within the trench 114, it is to be understood that the trench 114 may include two or more rows of the holes 402 as required by the design specifications of the integrated circuit packaging system 400.

In at least one embodiment, the surface area of each of the holes 402 can range from about one square angstrom to about one square micrometer. It is to be understood that the surface area of the holes 402 can be uniform or non-uniform. Accordingly, each side of the integrated circuit 112 may include up to several hundred of the holes 402. However, it is to be understood that the surface area and number of the holes 402 is not limited by the preceding examples and may include any size or number depending upon design specifications, such as fillet strength, chip size, and/or package size, of the integrated circuit packaging system 400.

Figure 6:
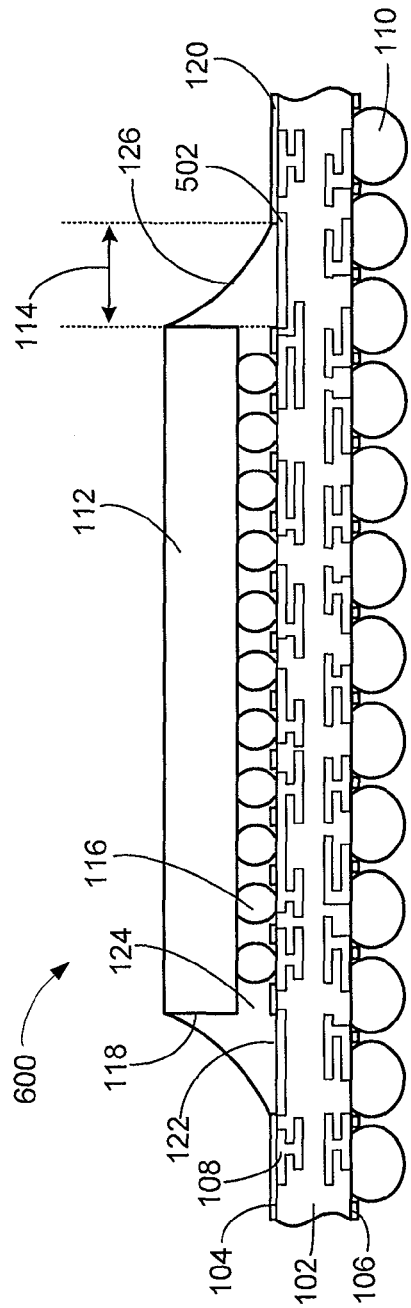
FIG. 6 is a cross sectional view of an integrated circuit packaging system in accordance with another embodiment of the present invention

Referring now to FIGS. 5 and 6. FIGS. 5 and 6 include some of the same reference numbers used to describe the integrated circuit packaging system 100, 200, 300, and 400 in FIGS. 1-4 and the process steps of FIGS. 1-4. It is noted that the layers, structures, and process steps corresponding to such reference numbers generally include the same characteristics (e.g., composition, thickness, function, process techniques, etc.) as those described in reference to FIGS. 1-4 and, therefore, their descriptions are not reiterated in detail for FIGS. 5 and 6. Rather the descriptions of the layers, structures, and process steps corresponding to reference numbers in FIGS. 1-4 are incorporated for the same reference numbers included in FIGS. 5 and 6.

It is to be understood that FIGS. 5 and 6 depict, by way of example and not by limitation, additional configurations and/or structures that can be employed for each of the integrated circuit packaging system's 100, 200, 300, and 400 of FIGS. 1-4.

Additionally, it is to be understood that for FIGS. 5 and 6, the terms grooves and holes can be used interchangeably. Accordingly, when the following descriptions use the term grooves, the term holes can be used as well.

Referring now to FIG. 5, therein is shown a cross sectional view of an integrated circuit packaging system 500 in accordance with another embodiment of the present invention. The integrated circuit packaging system 500 may include the substrate 102, the first side 104, the second side 106, the conductive pathways 108, the external terminal 110, the integrated circuit 112, the trench 114, the solder bump 116, the sidewall 118, the material layer 120, the grooves 122, the resin 124, the fillet structure 126, and the trench trace 502. FIG. 5 is representative of a cross-sectional view of FIGS. 2-4 taken along line 5-5.

Generally, the trench trace 502 can be formed directly underneath the entire length of the trench 114 or only underneath a portion of the trench 114. Further, it is to be appreciated that the width of the trench trace 502 can be larger, smaller than, or substantially equivalent in size to the width dimension of the trench 114 extending outward from the sidewall 118 of the integrated circuit 112. Regardless of the dimension of the trench trace 502, the grooves 122 within the trench 114 can be configured to expose a top surface 504 of the trench trace 502.

In at least one embodiment, the trench trace 502 may include a conductive material. In such cases, the trench trace may include a copper material or a copper material coated with a gold coating. In such cases, the trench trace 502 can be referred to as a dummy copper trace.

Although the current depicted embodiments show three of the grooves 122 formed within the trench 114, it is to be understood that the number of the grooves 122 may include two or more, just as with FIGS. 1-4.

It has been discovered that the trench trace 502 can help to prevent short circuits caused by poor board designs that form active wires underneath the trench 114. Typically, board design software attempts to put too much active wiring on the top surface of a board or the substrate 102, so tolerance variations result in short circuits of the active wires. The present inventors have discovered that by putting the trench trace 502 underneath the trench 114, the board design software cannot put active wires under the trench 114, so the number of short circuits can be minimized or eliminated.

It has also been discovered that the trench trace 502 can help to prevent moisture infiltration between the resin 124 and the material layer 120. Typically, the material layer 120, such as a solder resist, does not form a good bond with the resin 124 (e.g., an underfill) and sometimes the underfill delaminates. It has been discovered that the material of the trench trace 502 can form a good bond with the resin 124 and, thereby reduces moisture infiltration.

It has also been discovered that the trench trace 502 can help to prevent delamination between the resin 124 and the material layer 120. As noted above, the material layer 120, such as a solder resist, does not form a good bond with the resin 124 (e.g., an underfill) and sometimes the underfill delaminates. The present inventors have discovered that the material of the trench trace 502 can form a good bond with the resin 124 and, thereby reduces delamination.

Generally, the improved bond between the resin 124 and the trench trace 502 can provide a secure contact. Per this invention, a secure contact can be defined as the amount of contact adhesion between adjacent surfaces that prevents device failures due to separation of the surfaces during lifetime operations.

Referring now to FIG. 6, therein is shown a cross sectional view of an integrated circuit packaging system 600 in accordance with another embodiment of the present invention. The integrated circuit packaging system 600 may include the substrate 102, the first side 104, the second side 106, the conductive pathways 108, the external terminal 110, the integrated circuit 112, the trench 114, the solder bump 116, the sidewall 118, the material layer 120, the grooves 122, the resin 124, the fillet structure 126, and the trench trace 502. FIG. 6 is representative of a cross-sectional view of FIG. 3 taken along line 6-6.

Generally, the trench trace 502 can be formed directly underneath the entire length of the trench 114 or only underneath a portion of the trench 114. Further, it is to be appreciated that the width of the trench trace 502 can be larger, smaller than, or substantially equivalent in size to the width dimension of the trench 114 extending outward from the sidewall of the integrated circuit 112. Regardless of the trench trace 502 dimensions, the grooves 122 within the trench 114 can be configured to expose the top surface 504, of FIG. 5, of the trench trace 502.

In at least one embodiment, the trench trace 502 may include a conductive material. In such cases, the trench trace may include a copper material or a copper material coated with a gold coating. In such cases, the trench trace 502 can be referred to as a dummy copper trace.

Notably, the current embodiment depicts the trench trace 502 formed as a smooth surface without any projections. It is to be understood that the trench trace 502 of the current embodiments depicts a portion of FIG. 3 formed along one of the grooves 122 of FIG. 3 that is perpendicular to the sidewall 118.

As with FIG. 5, it has been discovered that the trench trace 502 can help to prevent short circuits, moisture infiltration, and delamination.

Generally, the improved bond between the resin 124 and the trench trace 502 can provide a secure contact. Per this invention, a secure contact can be defined as the amount of contact adhesion between adjacent surfaces that prevents device failures due to separation of the surfaces during lifetime operations.

Figure 7:
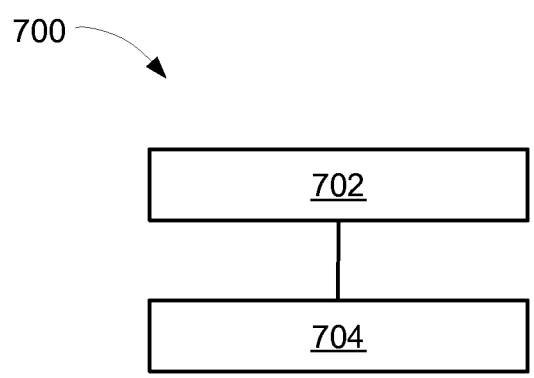
FIG. 7 is a flow chart of a method of manufacture of an integrated circuit packaging system in a further embodiment of the present invention.

Referring now to FIG. 7, therein is shown a flow chart of a method 700 of manufacture of an integrated circuit packaging system 100 in a further embodiment of the present invention. The method 700 includes: providing a substrate with a material layer including grooves in a fillet region that are substantially parallel and adjacent an integrated circuit in a block 702; and forming a resin between the substrate and the integrated circuit that contacts a trench trace exposed by the grooves in a block 704.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

It has been discovered that the present invention thus has numerous aspects. One such aspect is that the trench design of the integrated circuit packaging system provides reduced resin bleed out, regardless of the type of underfill material employed, because the grooves in the material layer act as a barrier to resin bleed. Notably, the effect of reduced resin bleed out is further enhanced for amine type underfill materials.

Another aspect of the present invention is that the trench provides enhanced mechanical strength at the interface between the resin and the material layer because the grooves within the material layer provide a locking effect to the resin. The portions of the material layer left between the grooves act as anchors or projections that the resin can attach to and from a strong bond. Additionally, the fillet strength can be improved due to the formation of the trench trace underneath the grooves that forms a stronger contact with the resin than a solder resist typically does.

Another aspect of the present invention is that the trench configuration provides improved moisture resistance by blocking moisture absorption that often occurs between the resin and the material layer, thereby increasing the reliability performance of the integrated circuit packaging system. Not wishing to be limited to any particular theory, the inventors believe that forming two or more of the grooves within the material layer provides a labyrinth type seal around the integrated circuit that reduces moisture absorption.

Another aspect of the present invention is that the above mentioned aspects can be achieved without increasing the footprint of the integrated circuit packaging system because the trench can be made entirely within the fillet region of the resin.

Yet another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a substrate having a first side with a material layer including parallel grooves within the material layer of a trench in a fillet region of the substrate;
   attaching an integrated circuit package to the substrate, sides of the integrated circuit package positioned substantially parallel to and adjacent the parallel grooves, wherein a first length of the parallel grooves adjacent opposing sides of the integrated circuit package is less than a length of the opposing sides, a second length of the parallel grooves adjacent other opposing sides is greater than a length of the other opposing sides, and the parallel grooves and the trench are formed around a perimeter of the integrated circuit package;
   exposing an embedded trench trace, of the substrate, from underneath the parallel grooves, the embedded trench trace having an area substantially equivalent to an area of the trench;
   forming a resin within the trench and between the substrate and the integrated circuit package, the resin contacting a top surface of the embedded trench trace exposed by the parallel grooves; and
   wherein:
   forming the resin includes exposing a visible side of the integrated circuit package completely from the resin, the visible side opposite and facing away from the first side of the substrate.

2. The method as claimed in claim 1 wherein:
   providing the material layer includes forming a solder resist over the substrate.

3. The method as claimed in claim 1 further comprising:
   configuring the parallel grooves to not overlap.

4. The method as claimed in claim 1 further comprising:
   configuring adjacent offset channels displaced outward of the integrated circuit package and substantially parallel the parallel grooves.

5. A method of manufacture of an integrated circuit packaging system comprising:
   providing a substrate having a first side with a material layer including perpendicular grooves intersecting parallel grooves within the material layer of a trench in a fillet region of the substrate, the perpendicular grooves positioned substantially perpendicular to the parallel grooves;
   attaching an integrated circuit package to the substrate, sides of the integrated circuit package positioned substantially parallel to the parallel grooves, wherein the parallel grooves have a length longer than a length of the sides, and the parallel grooves, the perpendicular grooves, and the trench are formed around a perimeter of the integrated circuit package;
   exposing an embedded trench trace, of the substrate, from underneath the perpendicular grooves and the parallel grooves, the embedded trench trace having an area substantially equivalent to an area of the trench;
   forming a resin within the trench and between the substrate and the integrated circuit package, the resin contacting a top surface of the embedded trench trace exposed by the perpendicular grooves and the parallel grooves; and wherein:
forming the resin includes exposing a visible side of the integrated circuit package completely from the resin, the visible side opposite and facing away from the first side of the substrate.

6. The method as claimed in claim 5 wherein:
providing the material layer includes forming a solder resist over the substrate.

7. The method as claimed in claim 5 wherein:
providing the integrated circuit package includes providing a flip chip.

8. The method as claimed in claim 5 further comprising:
configuring the perpendicular grooves as substantially perpendicular to the integrated circuit package.

9. The method as claimed in claim 5 further comprising:
configuring the parallel grooves and the perpendicular grooves as a cross-hatch design and to overlap.

10. A method of manufacture of an integrated circuit packaging system comprising:
providing a substrate having a first side with a material layer including holes within the material layer of a trench in a fillet region of the substrate, the holes configured as rows parallel to one another;
attaching an integrated circuit package to the substrate, wherein the holes in the trench, and the trench, are formed around a perimeter of the integrated circuit package;
exposing an embedded trench trace, of the substrate, from underneath the holes within the material layer, the embedded trench trace having an area substantially equivalent to an area of the trench;
forming a resin within the trench and between the substrate and the integrated circuit package, the resin contacting a top surface of the embedded trench trace exposed by the holes; and wherein:
forming the resin includes exposing a visible side of the integrated circuit package completely from the resin, the visible side opposite and facing away from the first side of the substrate.

11. The method as claimed in claim 10 wherein:
providing the material layer includes forming a solder resist over the substrate.

12. The method as claimed in claim 10 wherein:
providing the integrated circuit package includes providing a flip chip.

13. The method as claimed in claim 10 further comprising:
configuring the holes as substantially parallel adjacent offset rows displaced outward of the integrated circuit package.

14. The method as claimed in claim 10 further comprising:
configuring each one of the holes as a discrete opening.

15. An integrated circuit packaging system comprising:
a substrate having a first side with a material layer including parallel grooves within the material layer of a trench in a fillet region of the substrate, and an embedded trench trace of the substrate exposed from underneath the parallel grooves, the embedded trench trace having an area substantially equivalent to an area of the trench;
an integrated circuit package attached to the substrate, sides of the integrated circuit package positioned substantially parallel to and adjacent the parallel grooves, wherein a first length of the parallel grooves adjacent opposing sides of the integrated circuit package is less than a length of the opposing sides, a second length of the parallel grooves adjacent other opposing sides is greater than a length of the other opposing sides, and the parallel grooves and the trench are formed around a perimeter of the integrated circuit package; and
a resin within the fillet region and between the substrate and the integrated circuit package, the resin contacting a top surface of the embedded trench trace exposed by the parallel grooves and, a visible side of the integrated circuit package, opposite and facing away from the first side of the substrate, completely exposed from the resin.

16. The system as claimed in claim 15 wherein:
the material layer includes a solder resist over the substrate.

17. The system as claimed in claim 15 wherein:
the parallel grooves do not overlap.

18. The system as claimed in claim 15 further comprising:
adjacent offset channels displaced outward of the integrated circuit package and substantially parallel the parallel grooves.

19. An integrated circuit packaging system comprising:
a substrate having a first side with a material layer including perpendicular grooves intersecting parallel grooves within the material layer of a trench in a fillet region of the substrate, the perpendicular grooves positioned substantially perpendicular to the parallel grooves, and an embedded trench trace of the substrate exposed from underneath the perpendicular grooves and the parallel grooves, the embedded trench trace having an area substantially equivalent to an area of the trench;
the parallel grooves positioned substantially parallel to sides of an integrated circuit package, wherein the parallel grooves have a length longer than a length of the sides, and the parallel grooves, the perpendicular grooves, and the trench are formed around a perimeter of the integrated circuit package; and
a resin within the trench and between the substrate and the integrated circuit package, the resin contacting a top surface of the embedded trench trace exposed by the perpendicular grooves and the parallel grooves, and a visible side of the integrated circuit package, opposite and facing away from the first side of the substrate, completely exposed from the resin.

20. The system as claimed in claim 19 wherein:
the material layer includes a solder resist over the substrate.

21. The system as claimed in claim 19 wherein:
the integrated circuit package is a flip chip.

22. The system as claimed in claim 19 wherein:
the perpendicular grooves are oriented substantially perpendicular to the integrated circuit package.

23. The system as claimed in claim 19 wherein:
the parallel grooves and the perpendicular grooves configured having a cross-hatch design and to overlap.

24. An integrated circuit packaging system comprising:
a substrate having a first side with a material layer including holes within the material layer of a trench in a fillet region of the substrate, the holes configured as rows parallel to one another, and an embedded trench trace of the substrate exposed from underneath the holes, the embedded trench trace having an area substantially equivalent to an area of the trench;
an integrated circuit package attached to the substrate, wherein the holes in the trench, and the trench, are formed around a perimeter of the integrated circuit package; and
a resin within the fillet region and between the substrate and the integrated circuit package, the resin contacting a top surface of the embedded trench trace exposed by the holes, and a visible side of the integrated circuit package, opposite and facing away from the first side of the substrate, completely exposed from the resin.

25. The system as claimed in claim 24 wherein:
the material layer includes a solder resist over the substrate.

26. The system as claimed in claim 24 wherein:
the integrated circuit package is a flip chip.

27. The system as claimed in claim 24 wherein:
the holes are configured as substantially parallel adjacent offset rows displaced outward of the integrated circuit package.

28. The system as claimed in claim 24 wherein:
each one of the holes is a discrete opening.

* * * * *